US010692853B2

(12) United States Patent
Fujiwara et al.

(10) Patent No.: US 10,692,853 B2
(45) Date of Patent: Jun. 23, 2020

(54) ELECTROSTATIC DISCHARGE (ESD) ROBUST TRANSISTORS AND RELATED METHODS

(71) Applicant: SEMICONDUCTOR COMPONENTS INDUSTRIES, LLC, Phoenix, AZ (US)

(72) Inventors: Shuji Fujiwara, Hashima (JP); Richard Scott Burton, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 289 days.

(21) Appl. No.: 14/852,912

(22) Filed: Sep. 14, 2015

(65) Prior Publication Data
US 2017/0077083 A1   Mar. 16, 2017

(51) Int. Cl.
  *H01L 27/02*   (2006.01)
  *H01L 29/06*   (2006.01)
  (Continued)

(52) U.S. Cl.
  CPC ...... *H01L 27/0266* (2013.01); *H01L 27/0262* (2013.01); *H01L 29/0692* (2013.01); *H01L 29/7816* (2013.01); *H01L 29/808* (2013.01)

(58) Field of Classification Search
  CPC ............... H01L 29/808; H01L 29/0692; H01L 29/1095; H01L 29/0634; H01L 29/7835;
  (Continued)

(56) References Cited

U.S. PATENT DOCUMENTS 6,476,449 B1    11/2002 Lin
7,417,270 B2 *   8/2008 Hower ................. H01L 29/808
                                                            257/269
(Continued)

OTHER PUBLICATIONS

Fujiwara, S., Nakaya, K., Hirano, T., Okuda, T., Watanabe, Y., "Source engineering for ESD robust NLDMOS," published at 33rd Electrical Overstress/Electrostatic Discharge Symposium (EOS/ESD), p. 1-6, disclosed at conference proceedings at least as early as Sep. 16, 2011 at Anaheim CA.

(Continued)

Primary Examiner — Natalia A Gondarenko
(74) Attorney, Agent, or Firm — Adam R. Stephenson, Ltd.

(57) ABSTRACT

An electrostatic discharge robust semiconductor transistor (transistor) includes a semiconductor substrate of a first conductivity type, a substrate contact region of the first conductivity type coupled with the semiconductor substrate, a source region of a second conductivity type, a channel region of the second conductivity type, a gate region of the first conductivity type, a drain region having a first drain region of the first conductivity type and a second drain region of the second conductivity type, and an electrical conductor coupled over the second drain region and a portion of the first drain region. A portion of the first drain region not covered by the electrical conductor forms a resistive electrical ballast region configured to protect the transistor from electrostatic discharge (ESD) induced voltage pulses. In implementations the transistor includes a silicon controlled rectifier (SCR) junction field effect transistor (SCR JFET) or a laterally diffused metal-oxide semiconductor (SCR LDMOS).

20 Claims, 6 Drawing Sheets

(51) Int. Cl.
   *H01L 29/78* (2006.01)
   *H01L 29/808* (2006.01)
   *H01L 23/60* (2006.01)
(58) Field of Classification Search
   CPC ........... H01L 29/66901; H01L 29/7816; H01L
   29/1066; H01L 29/78; H01L 29/66681;
   H01L 29/0615; H01L 29/0661; H01L
   29/0623; H01L 29/0865; H01L 29/0886;
   H01L 29/41725; H01L 29/4238; H01L
   29/0834; H01L 29/73; H01L 29/80; H01L
   29/8086; H01L 29/7811; H01L 29/0619;
   H01L 29/0649; H01L 29/0653; H01L
   29/0696; H01L 29/7832; H01L 29/0847;
   H01L 29/66659; H01L 29/7838; H01L
   29/0843; H01L 29/0882; H01L 29/1083;
   H01L 29/41758; H01L 29/42316; H01L
   29/6606; H01L 29/66893; H01L
   29/66568; H01L 29/66674; H01L 29/70;
   H01L 29/7424; H01L 29/7801; H01L
   2924/13091; H01L 2924/1305; H01L
   2924/13055; H01L 2924/13062; H01L
   2224/49111; H01L 27/0259; H01L
   27/0266; H01L 27/0623; H01L 27/098;
   H01L 27/0617; H01L 21/02697; H01L
   21/761; H01L 21/8232; H01L 21/8248;
   H01L 23/528; H01L 23/60; H01L 23/62;
   H01L 27/0711; H01L 27/0248; H01L
   27/0921; H01L 29/7815; H01L 29/7826;
   H01L 29/7809; H01L 27/0262
   USPC .......... 257/285, E29.174, E29.176, E29.182,
   257/E29.187, 360, 356, 355, 372, 373,
   257/378, 341, 343, 344, 379
   See application file for complete search history.

(56) References Cited

U.S. PATENT DOCUMENTS

| 8,120,108 | B2* | 2/2012 | Pendharkar | H01L 27/0262 |
| | | | | 257/337 |
| 8,431,972 | B2* | 4/2013 | Alvarez | H01L 21/26513 |
| | | | | 257/285 |
| 2011/0128658 | A1* | 6/2011 | Su | H01L 27/0285 |
| | | | | 361/57 |
| 2016/0240526 | A1* | 8/2016 | Titus | H01L 27/0266 |

OTHER PUBLICATIONS

Pendharkar, S., Teggatz, R., Devore, J., Carpenter, J., Efland, T., Chin-Yu Tsai, "SCR-LDMOS. A novel LDMOS device with ESD robustness," published at the 12th International Symposium on Power Semiconductor Devices and ICs, p. 341-344, disclosed at conference proceedings in 2000 at Toulouse.

Jung-Ruey Tsai, Yuan-Min Lee, Min-Chin Tsai, Gene Sheu, Shao-Ming Yang, "Development of ESD robustness enhancement of a novel 800V LDMOS multiple RESURF with linear P-top rings," published at TENCON 2011—2011 IEEE Region 10 Conference, p. 760-763, disclosed at conference proceedings least as early as Nov. 24, 2011 at Bali.

Chin-Yu Tsai, Taylor Efland, Sameer Penharkar, Jozef Mitros, Alison Tessmer, Jeff Smith, John Erdeljac, Lou Hutter, "16-60V Rated LDMOS Show Advanced Performance in an 0.72um Evolution BiCMOS Power Technology," published in Technical Digest of International Electron Devices Meeting (IEDM) 1997 by IEEE, p. 367-370, disclosed at conference proceedings at least as early as Dec. 10, 1997 at Washington, DC.

Jeffrey Smith, Alison Tessmer, Lily Springer, Praful Madhani, John Erdeljac, Jozef Mitros, Taylor Efland, Chin-Yu Tsai, Sameer Pendharkar, Louis Hutter, "A 0.7 um Linear BiCMOS/DMOS Technology for Mixed-Signal/Power Applications," Published in Proceedings of the Bipolar/BiCMOS Circuits and Technology Meeting 1997, p. 155-157 by IEEE, disclosed at conference proceedings at least as early as Sep. 30, 1997 at Minneapolis, MN.

* cited by examiner

ELECTROSTATIC DISCHARGE (ESD) ROBUST TRANSISTORS AND RELATED METHODS

BACKGROUND

1. Technical Field

Aspects of this document relate generally to semiconductor transistors.

2. Background Art

A semiconductor transistor is a device used to amplify and/or switch an electronic signal. Semiconductor transistors may be subject to damage or altered behavior due to electrostatic discharge (ESD). There are a variety of models/standards that are used for designing and testing against transistor failure due to electrostatic discharge. These include the human body model (HBM), the charge device model (CDM) and the machine model (MM). The HBM simulates ESD due to discharge from a human being. The CDM simulates a charged device's discharge when it contacts a conductor. The MM simulates discharge from a non-human source to the device, such as from production equipment or a tool.

SUMMARY

Implementations of an electrostatic discharge (ESD) robust semiconductor transistor (transistor) may include: a semiconductor substrate of a first conductivity type; a substrate contact region of the first conductivity type coupled with the semiconductor substrate; a source region of a second conductivity type coupled with the semiconductor substrate; a channel region of the second conductivity type; a gate region of the first conductivity type; a drain region including a first drain region of the first conductivity type and a second drain region of the second conductivity type, and; an electrical conductor coupled over the second drain region and a portion of the first drain region; wherein a portion of the first drain region is not covered by the electrical conductor and becomes a resistive electrical ballast region configured to protect the transistor from electrostatic discharge (ESD) induced voltage pulses, and; wherein the transistor includes a silicon controlled rectifier junction field effect transistor (SCR JFET).

Implementations of an ESD robust semiconductor transistor may include one, all, or any of the following:

The first conductivity type may be P type conductivity, the second conductivity type may be N type conductivity, the channel region may include an N− channel region, and the transistor may include an N− channel SCR JFET.

The semiconductor substrate may include a P type substrate, the substrate contact region may include a P+ substrate contact region, the source region may include an N+ source region, the gate region may include a P+ gate region, the first drain region may include a P+ drain region, and the second drain region may include an N+ drain region.

The electrical conductor may include a silicide.

The resistive electrical ballast region may have a width of at least 3 microns.

The resistive electrical ballast region may form a separation layer between the electrical conductor and an electrically insulative region.

The transistor may have a stadium shape.

Implementations of an electrostatic discharge (ESD) robust semiconductor transistor (transistor) may include: a semiconductor substrate of a first conductivity type; a first substrate contact region of the first conductivity type coupled with the semiconductor substrate; a source region of a second conductivity type coupled with the semiconductor substrate; a channel region of the second conductivity type; a gate region of the first conductivity type; a drain region having a first drain region of the first conductivity type and a second drain region of the second conductivity type; a second substrate contact region of the second conductivity type coupled with the semiconductor substrate, and; an electrical conductor coupled over the second drain region and a portion of the first drain region; wherein a portion of the first drain region is not covered by the electrical conductor and becomes a resistive electrical ballast region configured to protect the transistor from electrostatic discharge (ESD) induced voltage pulses, and; wherein the transistor includes a silicon controlled rectifier junction field effect transistor (SCR JFET).

Implementations of an ESD robust semiconductor transistor may include one, all, or any of the following:

The first conductivity type may be P type conductivity and the second conductivity type may be N type conductivity, wherein the channel region includes an N− channel region, and wherein the SCR JFET includes an N− channel SCR JFET.

The semiconductor substrate may include a P type substrate, the first substrate contact region may include a P+ substrate contact region, the source region may include an N+ source region, the channel region may include an N− channel region, the gate region may include a P+ gate region, the first drain region may include a P+ drain region (P+ anode), the second drain region may include an N+ drain region, and the second substrate contact region may include an N+ substrate contact region (N+ cathode).

The electrical conductor may include a silicide.

The resistive electrical ballast region may have a width of at least 3 microns.

The resistive electrical ballast region may form a separation layer between the electrical conductor and an electrically insulative region.

The transistor may have a stadium shape.

Implementations of an electrostatic discharge (ESD) robust semiconductor transistor (transistor) may include: a semiconductor substrate of a first conductivity type; a substrate contact region of the first conductivity type coupled with the semiconductor substrate through a first well region of the first conductivity type, the first well region separating the substrate contact region from the semiconductor substrate; a source region of a second conductivity type coupled with the semiconductor substrate; a second well region of the second conductivity type coupled with the semiconductor substrate; a drain region having a first drain region of the first conductivity type and a second drain region of the second conductivity type; a gate region, and; a silicide coupled over the second drain region and a portion of the first drain region; wherein a portion of the first drain region is not covered by the silicide and becomes a resistive electrical ballast region having a width of at least 3 microns, the resistive electrical ballast region configured to protect the transistor from electrostatic discharge (ESD) induced voltage pulses, and; wherein the transistor includes a silicon controlled rectifier field effect transistor (SCR FET).

Implementations of an ESD robust semiconductor transistor may include one, all, or any of the following:

The SCR FET may include a laterally diffused metal-oxide semiconductor (SCR LDMOS) transistor.

The first conductivity type may be P type conductivity and the second conductivity type may be N type conductivity.

The semiconductor substrate may include a P type substrate, the substrate contact region may include a P+ substrate contact region, the first well region may include a P well region, the second well region may include an N well region, the source region may include an N+ source region, the gate region may include an N+ gate region, the first drain region may include a P+ drain region, and the second drain region may include an N+ drain region.

The first well region may fully separate the substrate contact region from the semiconductor substrate and the first well region may directly contact the semiconductor substrate.

The second well region may fully separate the first well region from the semiconductor substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended electrostatic discharge (ESD) robust transistors and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such ESD robust transistors and related methods, and implementing components and methods, consistent with the intended operation and methods.

Figure 1:
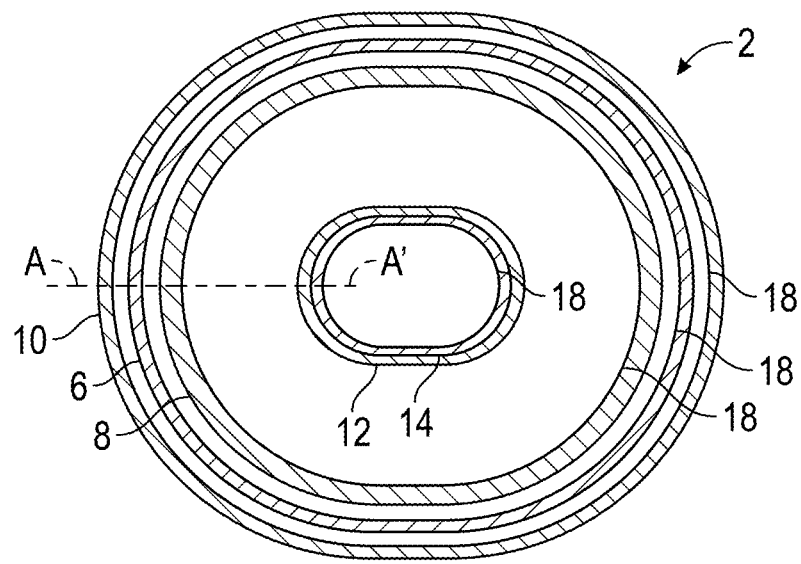
FIG. 1 is a top view of an implementation of a semiconductor transistor.

Referring now to FIG. 1, an implementation of a semiconductor transistor (transistor) 2 is shown. In the implementation shown the transistor is a silicon controlled rectifier junction field effect transistor (SCR JFET), though the transistor could have a different configuration/use. Similarly, in the implementation shown the transistor has a stadium shape, though in other implementations other closed shapes, such as circular, elliptical, or rectangular, could be used.

Figure 2:
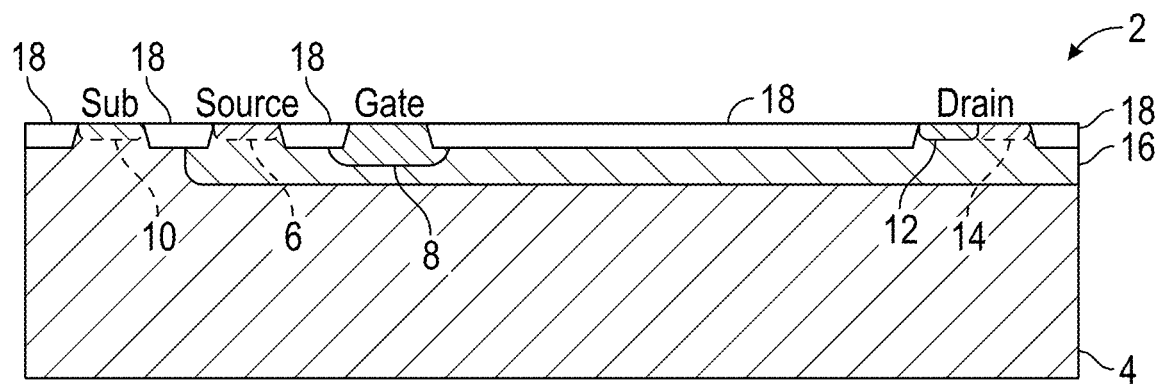
FIG. 2 is a side cross-section view of the semiconductor transistor of FIG. 1 taken along line A-A'.

FIG. 2 is a cross-section view of the transistor of FIG. 1 taken along line A-A. Referring now to FIGS. 1-2, the transistor 2 includes a semiconductor substrate 4. In the implementation shown the substrate is a P type (p doped) substrate, though in other implementations other configurations (such as an N type (n doped) substrate) could be used. Thus, in the implementation shown the gate/channel/substrate forms a PNP configuration, though in other implementations this could be configured so that an NPN configuration is formed.

The configuration (P type, N type, etc.) of the semiconductor substrate may be manufactured using any number of doping, diffusion, and/or annealing steps, or the like, with a silicon substrate, by non-limiting example. As will be described below, the transistor further includes electrically insulative regions, drain regions, gate regions, source regions, substrate contact regions, and the like, each of which may have different electrical and/or other properties. The different regions may be formed by any number or combination of masking (photoresist), exposing, etching, washing, doping, implanting, diffusing, annealing, and/or other steps, using appropriate materials and dopants, and the like.

The transistor 2 includes source, gate, drain, and channel regions. The channel region may be an N– channel region 16. The gate, source, and drain regions are all coupled with (and, in the implementations shown, are in direct contact with) the channel region, thus electrical current may flow between the source and drain through the channel and may be controlled by the gate. The source region (labeled "Source" in FIG. 2) is an N+ source region 6 and is separated from the nearby gate region using an electrically insulative region 18. The gate region (labeled "Gate" in FIG. 2) is a P+ gate region 8, thus the gate, channel and substrate form a PNP structure.

The drain region (labeled "Drain" in FIG. 2) is separated from the gate region using an electrically insulative region 18. The drain region includes both a P+ drain region 12 (P+ anode) and an N+ drain region 14. A substrate contact region is also included (labeled "Sub" in FIG. 2) and is separated from the source region with an electrically insulative region 18. The substrate contact region in the implementation shown is a P+ substrate contact region 10.

A number of electrically insulative regions 18 separate the source, gate and drain at the surface of the transistor. The electrically insulative regions may be formed of, by non-limiting example, Sift, or any other electrically insulative material.

Although the various regions in the representative example are formed of particular material types, i.e., a P type substrate, N+ source region, P+ gate region, P+ substrate contact region, P+ drain region (P+ anode), N+ drain region, N– channel region, silicide region, and so forth, other material types and combinations could be chosen by the practitioner of ordinary skill having similar or different electrical or other properties as desired (for instance beginning with an N type substrate and choosing the other material types accordingly).

Figure 3:
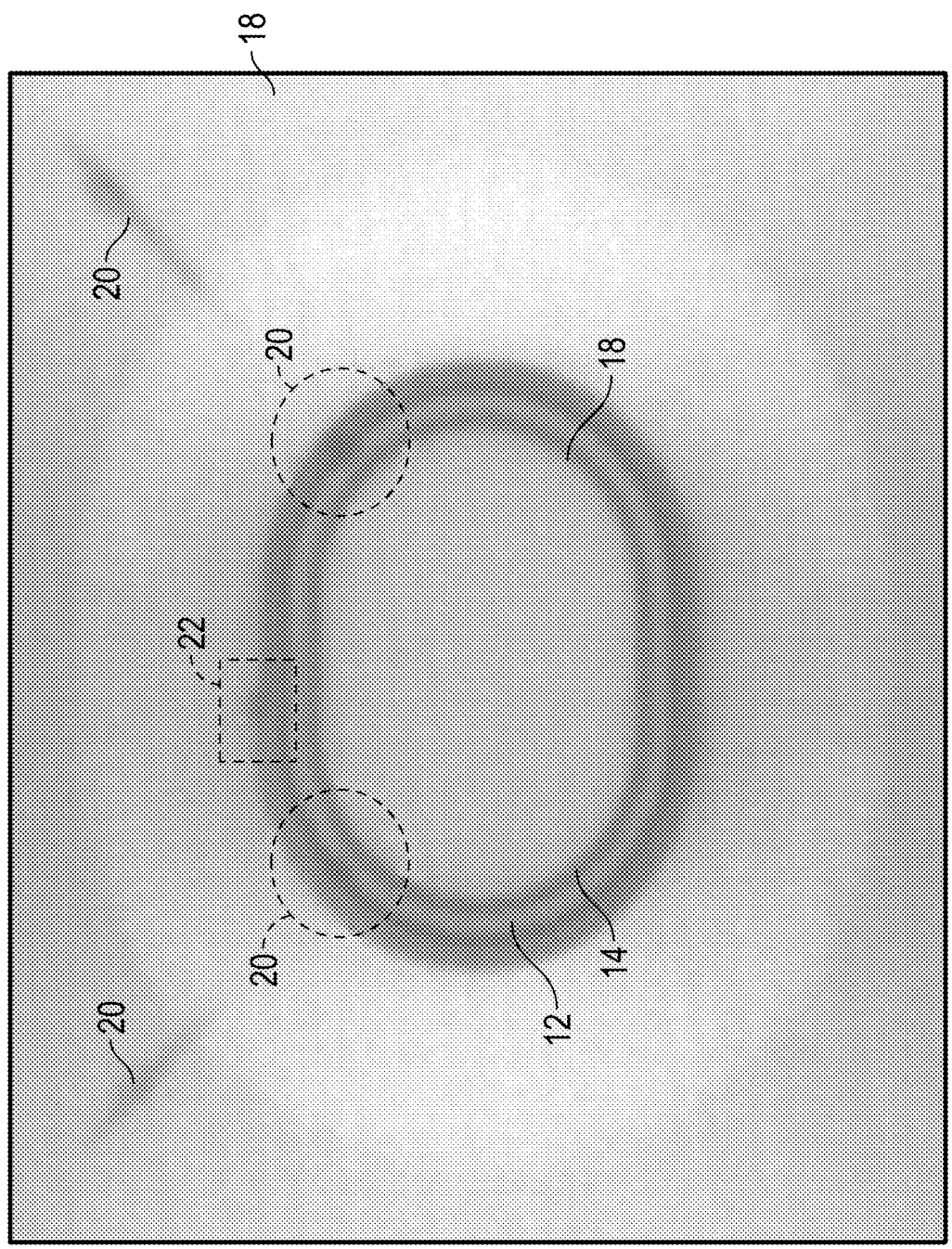
FIG. 3 is an infrared microscope photograph of a close-up top view of a semiconductor transistor having the configuration of FIG. 1 in a damaged state.

FIG. 3 is a top close-up view of an infrared microscope photograph of a transistor having the configuration of transistor 2 but having damaged regions 20 resulting from electrostatic discharge (ESD). As indicated above, there are a number of sources of ESD, including contact with a human body, discharge of a charged device itself, or discharge from a tool or production implement that comes into contact with the device. The device of FIG. 3 was an 800 V SCR-JFET and was stressed with a single 2500 V HBM pulse. FIG. 3 shows four damaged regions 20. The upper two are filament-like failure spots at the channel region. There are also two damaged regions 20 in the drain region (within dotted-line circles). The dotted square of FIG. 3 shows a non-damaged region 22, and is simply metal routing of the transistor that appears darker in the infrared microscope photograph. Naturally, damaged areas, as those shown in FIG. 3, can lead to undesirable transistor operation or likely failure.

Figure 4:
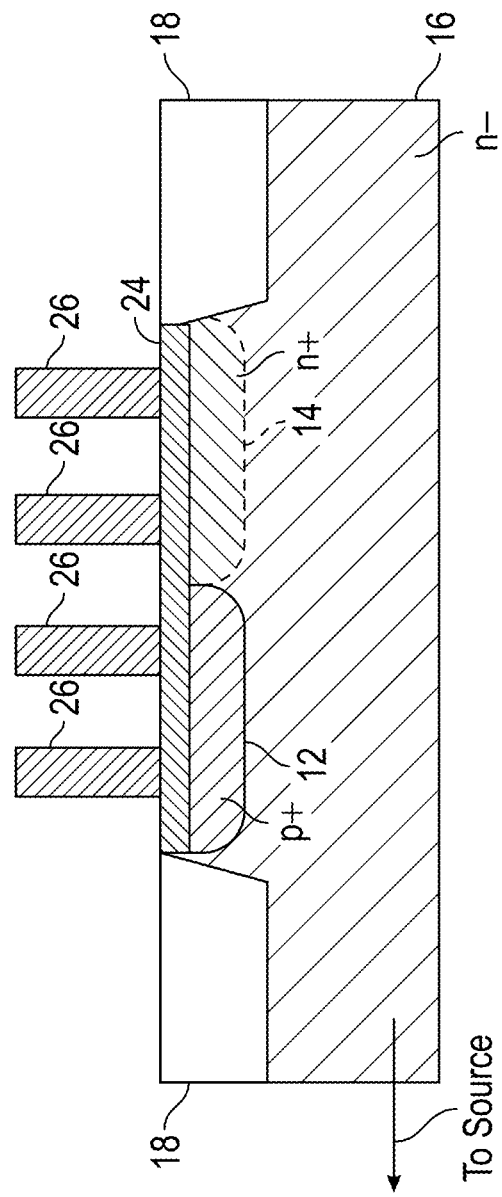
FIG. 4 is a close-up side cross-section view of a drain region of the semiconductor transistor of FIG. 1.

FIG. 4 is a close-up view of the drain region of transistor 2. An electrical conductor 24 is shown laid over the P+ drain region 12 and over the N+ drain region 14. The electrical conductor fully covers the P+ and N+ drain regions. In the implementation shown the electrical conductor is an electrically conductive silicide region, though in other implementations it could be formed of some other conductor, such as a metal layer. A number of electrically conductive leads 26 are coupled with the electrical conductor 24, thus the drain region of transistor 2 may be in electrical communication with an external element or some other element through the electrical conductor and the electrically conductive leads.

Figure 5:
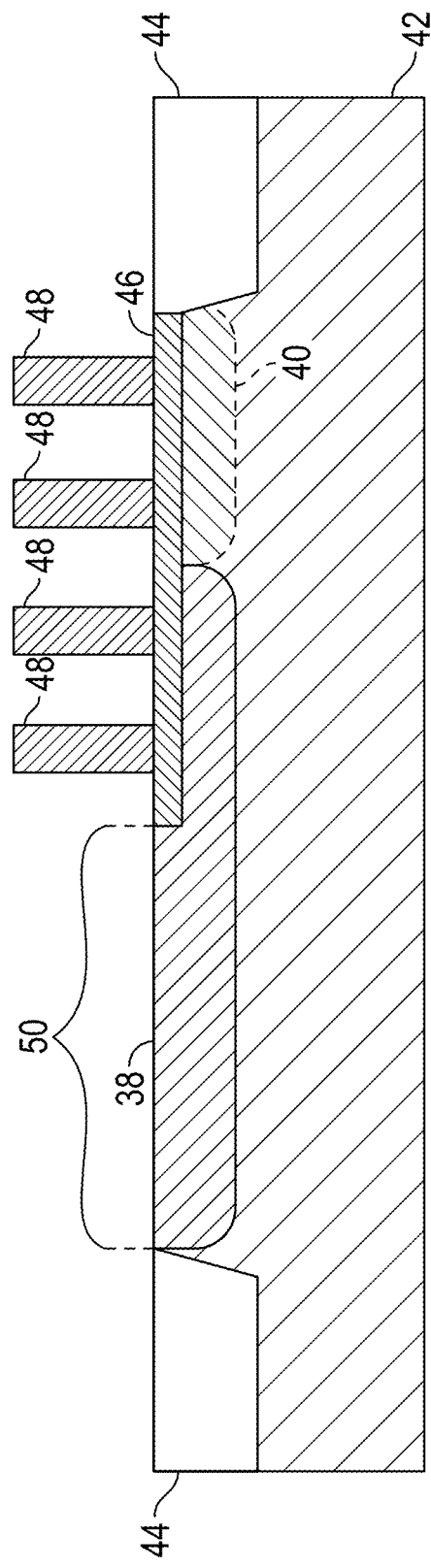
FIG. 5 is a close-up side cross-section view of a drain region of an implementation of an electrostatic discharge (ESD) robust semiconductor transistor.

FIG. 5 shows a close-up cross-section view of a drain region of an electrostatic discharge (ESD) robust semiconductor transistor (transistor) 28. In the implementation shown the transistor 28 has many similarities to transistor 2 and is a silicon controlled rectifier junction field effect transistor (SCR JFET), though in other implementations transistor 28 could have some other configuration/use.

FIG. 5 illustrates that the drain region of transistor 28 is coupled with an N− channel region 42. Electrically insulative regions 44 separate the drain region from other portions of the transistor. The electrically insulative regions 44 may be formed of any materials that electrically insulative regions 18 may be formed of. The drain region is seen as including a P+ drain region (P+ anode) 38 and an N+ drain region 40. An electrical conductor 46 is laid over these two drain regions. The electrical conductor in the implementation shown is an electrically conductive silicide region, though in other implementations it could be formed of a metal or another electrically conductive element. Electrically conductive leads 48 couple with the electrical conductor 46 and may be used to electrically couple the drain region with an external element or some other device.

As can be seen from FIG. 5, the electrical conductor 46 of transistor 28 does not fully cover the P+ drain region 38. Instead, a gap is left, which forms and/or becomes a resistive electrical ballast region (separation layer) 50. This resistive electrical ballast region (separation layer) 50 may greatly enhances the ESD robustness of the transistor.

Figure 6:
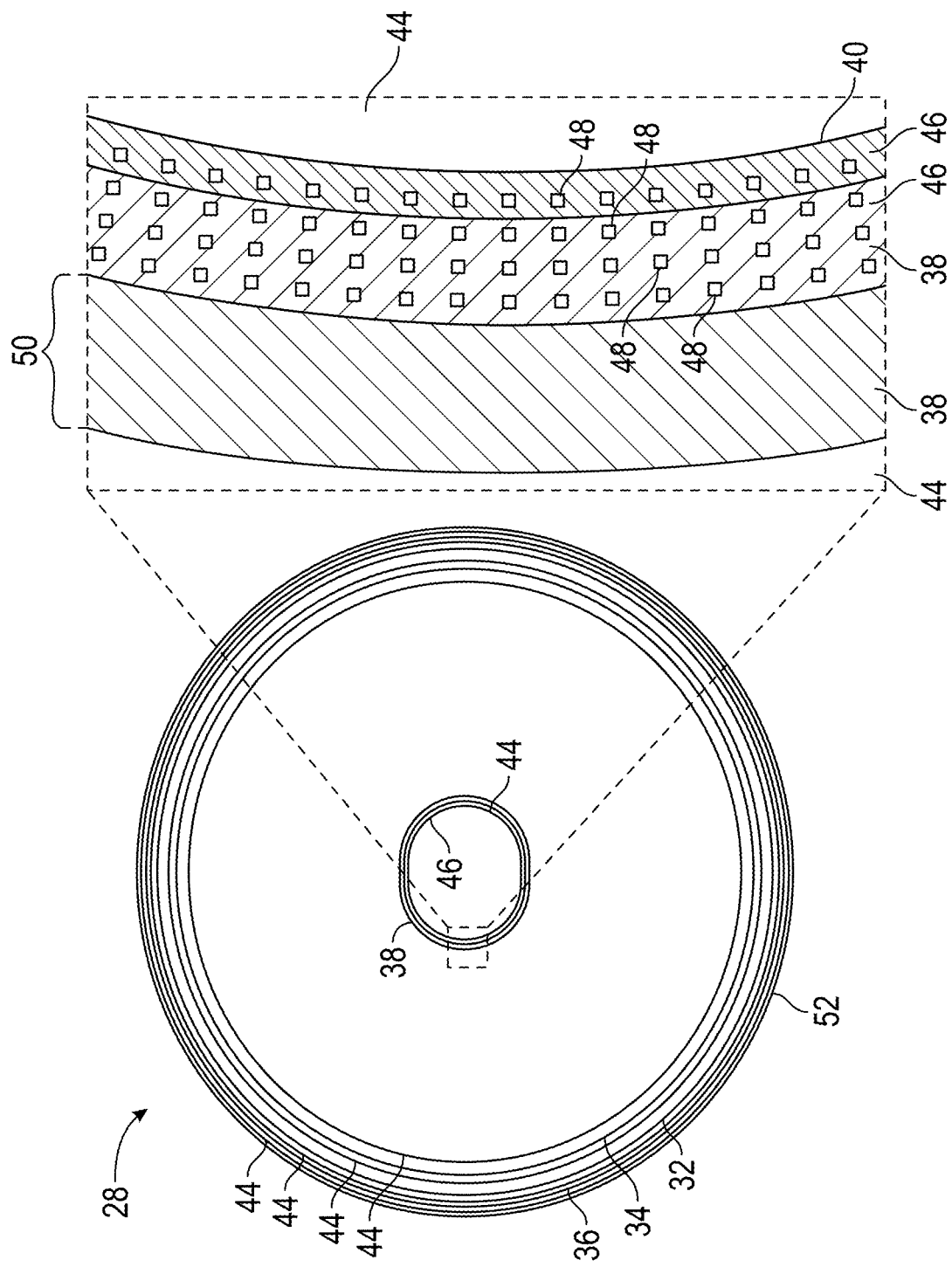
FIG. 6 is top and enlarged views of an implementation of an ESD robust semiconductor transistor.

FIG. 6 shows a top view of an implementation of a transistor 28 having a first configuration in which the drain region forms a stadium shape and the source, gate, and other regions form circle shapes. A number of electrically insulative regions 44 separate the various other regions of the transistor. In the left side of FIG. 6 is a close up magnified view that shows an N+ cathode region 52, a P+ substrate contact region 36, a gate region (which in the implementation shown is a P+ gate region 34), an N+ source region 32, a P+ drain region 38 (P+ anode), and an electrical conductor 46.

In the close-up view on the right hand side of FIG. 6 the elements of the drain region are shown more closely and somewhat in see-through. The N+ drain region 40 is shown along with the P+ drain region 38. The electrical conductor 46 completely covers the N+ drain region and a portion of the P+ drain region. Electrically conductive leads 48 are coupled with the electrical conductor 46. A portion of one of the electrically insulative regions 44 is also shown in the close-up view. The resistive electrical ballast region (separation layer) 50 is that portion of the P+ drain region which is not covered with the electrical conductor 46.

Figure 7:
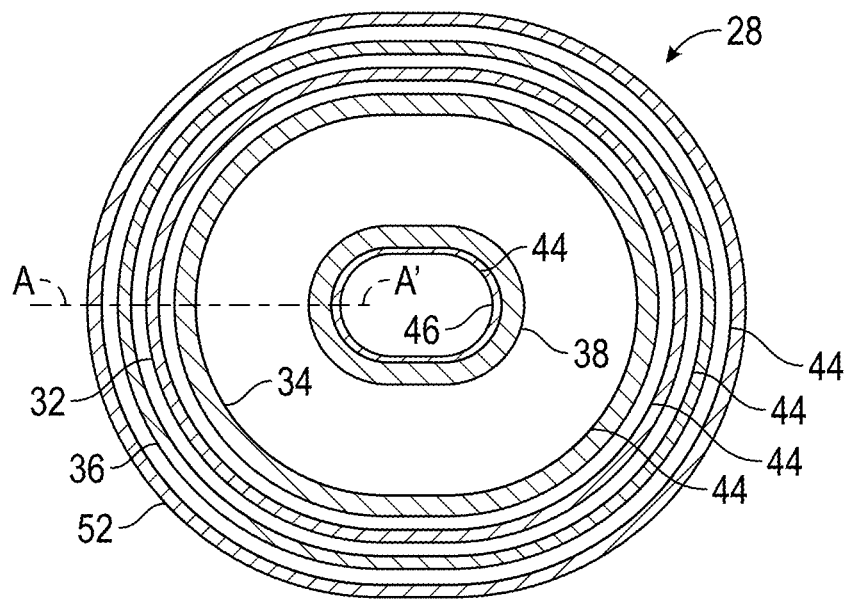
FIG. 7 is a top view of an implementation of an ESD robust semiconductor transistor.

FIG. 7 shows a top view of another configuration for a transistor 28 in which the drain region and the other regions all form stadium shapes. FIG. 7 shows various regions including an N+ cathode region 52, a P+ substrate contact region 36, an N+ source region 32, a P+ gate region 34, a P+ drain region 38, an electrical conductor 46, and a number of electrically insulative regions 44. Shapes other than circles, stadiums and/or ellipses could be formed with the various elements of the transistor.

Figure 8:
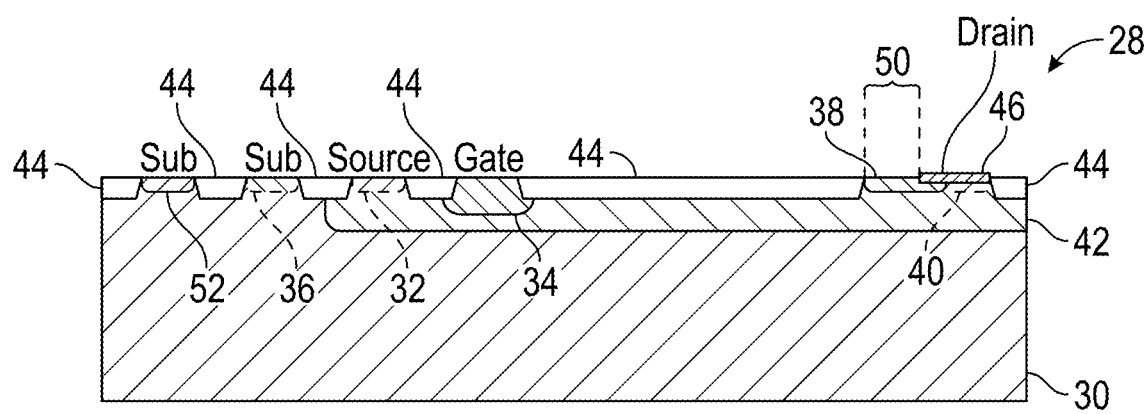
FIG. 8 is a side cross-section view of the ESD robust semiconductor transistor of FIG. 7 taken along line A-A'.

FIG. 8 is a side cross-section view of the transistor 28 of FIG. 7 taken along line A-A. The semiconductor substrate 30 of transistor 28 is a P type substrate, and thus the gate/channel/substrate forms a PNP structure, but as described above with respect to transistor 2, transistor 28 could be fabricated having an N type substrate and having an NPN gate/channel/substrate structure. Various configurations could be formed by a practitioner of ordinary skill in the art to form transistors which are different from those disclosed in the drawings but which include the resistive electrical ballast regions (separation layers) 50 to provide the ESD robustness.

An N+ cathode region 52 is included (leftmost item labeled "Sub" in FIG. 8) and is coupled with (and, in the implementation shown, is in direct contact with) the semiconductor substrate 30. A P+ substrate contact region 36 (rightmost item labeled "Sub" in FIG. 8) is coupled with (and, in the implementation shown, is in direct contact with), the semiconductor substrate 30. An N− channel region 42 is included in the semiconductor substrate and the source, gate, and drain regions are all coupled with the N− channel region.

The N+ source region 32 (labeled "Source" in FIG. 8) is coupled with the N− channel region and, in the implementation shown, is in direct contact therewith. The gate region 34 (labeled "Gate" in FIG. 8) is a P+ gate region and is coupled with (and in direct contact with) the N− channel region. The drain region (labeled "Drain" in FIG. 8) includes a P+ drain region 38 (P+ anode) and an N+ drain region 40. An electrical conductor 46 is shown covering all of the N+ drain region and a portion of the P+ drain region, thus the uncovered portion of the P+ drain region forms or becomes a resistive electrical ballast region (separation layer) 50. A number of electrically insulative regions 44 separate the other regions at the surface of transistor 28 and may be formed of, by non-limiting example, Sift or any other electrically insulative material. As described above, the electrical conductor 46 in implementations is an electrically conductive silicide, though in other implementations it may be formed of another electrically conductive material, such as a metal, and electrically conductive leads 48 may be coupled with the electrical conductor 46 as described above.

The configuration (P type, N type, etc.) of the substrate of transistor 28 may be configured utilizing any number of doping, diffusion, and/or annealing steps, or the like, with a silicon substrate, by non-limiting example. The various electrically insulative regions, drain regions, gate regions, source regions, substrate contact regions, cathode regions, and the like, each of which may have different electrical and/or other properties, may be formed by any number or combination of masking (photoresist), exposing, etching, washing, doping, implanting, diffusing, annealing, and/or other steps, using appropriate materials and dopants, and the like.

Although the various regions of transistor 28 are denoted by particular material types, i.e., a P type substrate, N+ source region, P+ gate region, P+ substrate contact region, P+ drain region (P+ anode), N+ drain region, N− channel region, silicide region, N+ cathode region, and so forth, other material types and combinations could be chosen by the practitioner of ordinary skill having similar or different electrical or other properties as desired (for instance beginning with an N type substrate and choosing the other material types accordingly).

As indicated to some extent above, the resistive electrical ballast regions are buffer regions or layers between the gate/source and the drain and help to increase the robustness of the device to damage from ESD. In implementations the resistive electrical ballast region 50 could be even greater, such as up to about 10 microns, in width. However, in experiments a 6 micron width for the resistive electrical ballast region (separation layer) 50 did not show notable improvement in ESD robustness over a 3 micron width. Simulation data indicated that the effect of a 1 micron width resistive electrical ballast region (separation layer) 50 was much less effective than a 3 micron width region, and that the protection from a 5 micron width region was similar to that of a 3 micron width region. Thus it appears that the protective benefits may be located in a range of widths of about 3-5 microns.

In various implementations, the transistor is an ultra-high voltage device and the depletion layer, at several hundred volts of operation, must extend about 100 microns in depth. In such circumstances it may be desirable to have a P type semiconductor substrate instead of an N type semiconductor substrate. An alternative may be to form a thick P epitaxial layer on an N doped substrate, but in such a case the overall thickness may need to be more than 100 microns and may make this option less desirable.

The configuration of transistor 28 shows an improved ESD robustness for an ultra high voltage (800 V) silicon controlled rectifier junction field-effect transistor (SCR-JFET). Although there have been laterally diffused metal oxide semiconductors (LDMOS) with a silicon controlled rectifier (SCR) structure that have exhibited acceptable ESD robustness, achieving ESD robustness in the ultra high voltage range (>800 V) has remained a challenging issue.

Most of the ESD surge current flows not from the N+ drain region but from the P+ drain region (P+ anode of the SCR), thus the extension of the P+ drain region creates an effective resistive electrical ballast region (separation layer) 50 that increases the ESD robustness. The addition of the resistive electrical ballast region 50 does not greatly alter the size of the overall device. In a representative example the diameter of a reference device without the resistive electrical ballast region 50 was 410 microns, and the width of the resistive electrical ballast region 50 was 3 microns, so the overall diameter of the altered device was 416 microns. The area penalty for the addition of the resistive electrical ballast region 50 is negligible.

HBM robustness of an 800 V SCR-JFET transistor 28 with the resistive electrical ballast region 50 was measured and compared with a similar 800 V SCR-JFET without the resistive electrical ballast region 50. Both transistors had a same drain width of 1900 microns. HBM robustness was improved from about 2000 V to 6000 V by implementing the resistive electrical ballast region 50

The transistors described herein may be used in a variety of product such as, by non-limiting example: off-line pulse width modulation (PWM) controllers for consumer and computing power supplies; 700 V startup product families such as adapters, flat TVs, low power, LED lighting; HB drivers, as a power transistor, and the like.

Figure 9:
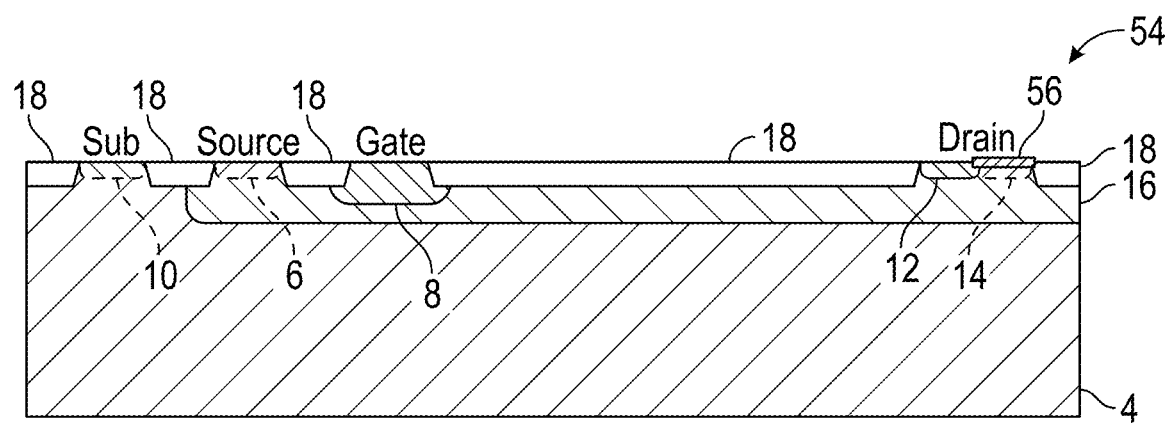
FIG. 9 is a side cross-section view of an implementation of an ESD robust semiconductor transistor.

Referring now to FIG. 9, in implementations an electrostatic discharge (ESD) robust semiconductor transistor (transistor) 54 has a structure similar to transistor 28 except without the N+ cathode region 52. The other elements are similar, including the resistive electrical ballast region (separation layer), similar to that of transistor 28, and in implementations this resistive electrical ballast region (separation layer) may be 3 microns or more in width, similar as has been discussed herein relative to transistor 28. Transistor 54 is thus in some ways functionally and structurally similar to transistor 28.

In transistor 54, a PNPN path exists from the P+ drain region (P+ anode) 12, through the N− channel region 16, through the P type substrate 4 or the P+ gate region 8, then via the N− channel region 16 to the N+ source region 6 which acts as an N+ cathode, and therefore transistor 54 forms a silicon controlled rectifier (SCR) structure. Transistor 28 also has a PNPN path similar to transistor 54 from P+ drain region (P+ anode) 38, through the N− channel region 42, through the P type substrate 30 or the P+ gate region 34, then via N− channel region 42 to the N+ source region 32 which acts as an N+ cathode, and therefore transistor 28 forms a silicon controlled rectifier (SCR) structure. Transistor 28 forms another PNPN path from the P+ drain region (P+ anode) 38, through the N− channel region 42, through the P type substrate 30, and through the N+ cathode region 52. Thus there are two current paths that allow the SCR structure in transistor 28. The N+ cathode region 52 allows the N+ source region 32 to not be grounded, which in implementations may result in more flexible circuit design.

In implementations, most of the current may go through the P type substrate but in other implementations the P+ gate may form a portion of a PNPN path as described above.

Figure 10:
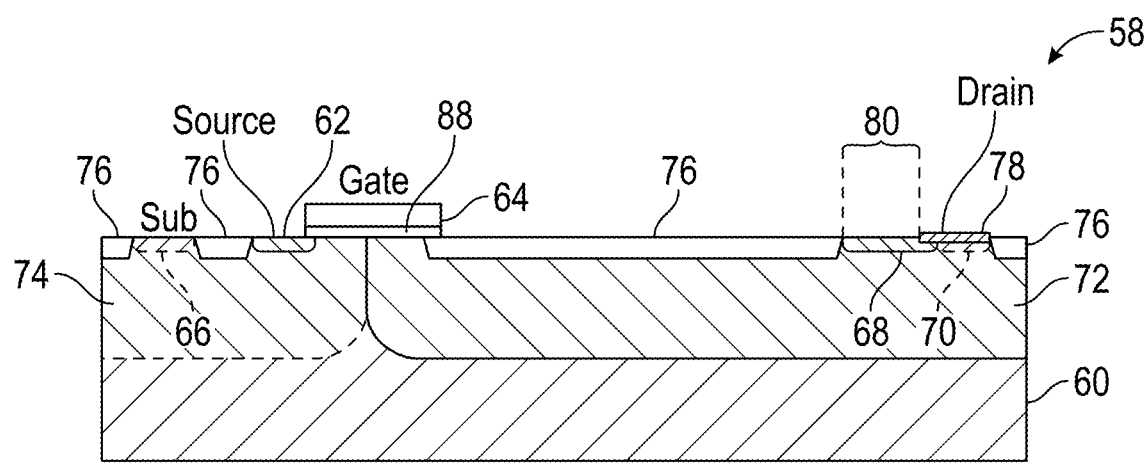
FIG. 10 is a side cross-section view of an implementation of an ESD robust semiconductor transistor.

FIG. 10 shows a representative example of an ESD robust semiconductor transistor (transistor) 58 formed using a laterally-diffused metal-oxide semiconductor (LDMOS) process/structure. The transistor 58 includes a semiconductor substrate 60 which in implementations is a P type substrate, though in other implementations it could be an N type substrate. An N well region 72 and a P well region 74 are included, and a gate region 64 couples with both of the well regions through an oxide 88, forming the metal-oxide semiconductor (MOS) structure. In implementations the gate region is an N+ gate region, though in other implementations other configurations could be used for the gate region.

The N well region and P well region are next to one another and a source region 62 resides above (and is in direct contact with) the P well region. In implementations the source region is an N+ source region. A P+ substrate contact region 66 also resides above (and is in direct contact with) the P well region. The P+ substrate contact region 66 is coupled with the P type substrate through the P well region and the P well region fully separates the P+ substrate contact region from the semiconductor substrate.

The drain region of the transistor 58 includes a P+ drain region (P+ anode) 68 and an N+ drain region 70. A number of electrically insulative regions 76 are located at the upper surface of the device and between the various other elements and contacts, and may include SiO$_2$ or some other electrically insulative material. A silicide 78 covers all of the N+ drain region and a portion of the P+ drain region, and may be formed of any electrically conductive silicide material. A resistive electrical ballast region (separation layer) 80 is thus formed, and operates similarly to others described herein by increasing the ESD robustness of the transistor. In implementations the resistive electrical ballast region (separation layer) 80 may have a width ranging from 3-10 microns. In implementations the resistive electrical ballast region (separation layer) 80 has a width of at least 3 microns. The resistive electrical ballast region forms a separation layer between the silicide and an electrically insulative region 76 of the transistor. Transistor 58 is an LDMOS transistor.

Figure 11:
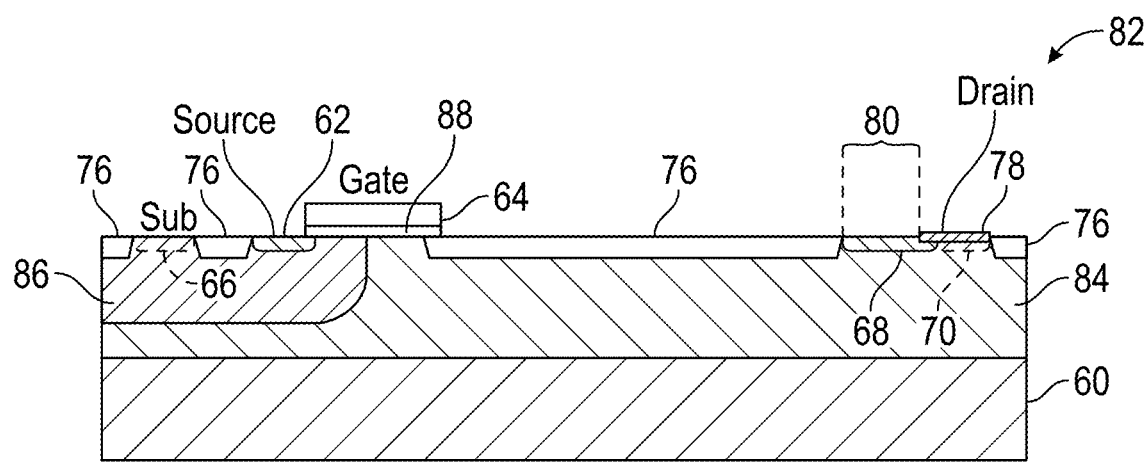
FIG. 11 is a side cross-section view of an implementation of an ESD robust semiconductor transistor.

FIG. 11 shows a representative example of an ESD robust semiconductor transistor (transistor) 82 formed using an LDMOS process/structure and is similar to transistor 58 except that the N well region 84 extends below the P well region 86 and therefore fully separates the P well region from the P type substrate, thus forming a PNP structure vertically below the P+ substrate contact region (P well region, N well region, and P type substrate stacked vertically). A silicide 78 covers all of the N+ drain region and a portion of the P+ drain region, and may be formed of any electrically conductive silicide material. A resistive electrical ballast region (separation layer) 80 is formed, and operates similarly to others described herein by increasing the ESD robustness of the transistor. In implementations the resistive electrical ballast region (separation layer) 80 may have a width ranging from 3-10 microns. In implementations the resistive electrical ballast region (separation layer) 80 has a width of at least 3 microns. The resistive electrical ballast region forms a separation layer between the silicide and an electrically insulative region 76 of the transistor. Transistor 82 is an LDMOS transistor.

As used herein, "conductivity type" refers to either P type (including P, P+, P−) and/or N type (including N, N+, N−) conductivity.

As disclosed above, and referring again to FIG. 9, in implementations an ESD robust semiconductor transistor (transistor) 54 includes a semiconductor substrate 4 of a first conductivity type, a substrate contact region 10 of the first conductivity type coupled with the semiconductor substrate, a source region 6 of a second conductivity type coupled with the semiconductor substrate, a channel region 16 of the second conductivity type, a gate region 8 of the first conductivity type, a drain region having a first drain region 12 of the first conductivity type and a second drain region 14 of the second conductivity type, and an electrical conductor 56 coupled over the second drain region and a portion of the first drain region, wherein a portion of the first drain region is not covered by the electrical conductor and becomes a resistive electrical ballast region configured to protect the transistor from ESD induced voltage pulses, and wherein the transistor forms a silicon controlled rectifier junction field effect transistor (SCR JFET).

Referring still to FIG. 9, in implementations the first conductivity type is P type conductivity and the second conductivity type is N type conductivity, though these polarities may be reversed in other implementations. In implementations the channel region 16 is an N− channel region, and the transistor is an N− channel SCR JFET. In implementations the semiconductor substrate 4 is a P type substrate, the substrate contact region 10 is a P+ substrate contact region, the source region 6 is an N+ source region, the gate region 8 is a P+ gate region, the first drain region 12 is a P+ drain region, and the second drain region is an N+ drain region. The electrical conductor 56 may include, or may be fully formed of, a silicide. The resistive electrical ballast region may have a width of at least 3 microns and may form a separation layer between the electrical conductor and an electrically insulative region 18. The transistor may form a stadium shape.

Referring to FIG. 8, in implementations an ESD robust semiconductor transistor (transistor) 28 includes a semiconductor substrate 30 of a first conductivity type, a first substrate contact region 36 of the first conductivity type coupled with the semiconductor substrate, a source region 32 of a second conductivity type coupled with the semiconductor substrate, a channel region 42 of the second conductivity type, a gate region 34 of the first conductivity type, a drain region having a first drain region 38 of the first conductivity type and a second drain region 40 of the second conductivity type, a second substrate contact region 52 of the second conductivity type coupled with the semiconductor substrate, and an electrical conductor 46 coupled over the second drain region and a portion of the first drain region, wherein a portion of the first drain region not covered by the electrical conductor forms a resistive electrical ballast region 50 configured to protect the transistor from ESD induced voltage impulses, and wherein the transistor includes a silicon controlled rectifier junction field effect transistor (SCR JFET).

Still referring to FIG. 8, in implementations the first conductivity type is P type conductivity and the second conductivity type is N type conductivity, though these polarities may be reversed in other implementations. In implementations the channel region includes an N− channel region, and the SCR JFET includes an N− channel SCR JFET. In implementations the semiconductor substrate includes a P type substrate, the first substrate contact region includes a P+ substrate contact region, the source region includes an N+ source region, the channel region includes an N− channel region, the gate region includes a P+ gate region, the first drain region includes a P+ drain region (P+ anode), the second drain region includes an N+ drain region, and the second substrate contact region includes an N+ substrate contact region (N+ cathode). In implementations the electrical conductor 46 includes, or is fully formed of, a silicide. The resistive electrical ballast region 50 may include a width of at least 3 microns and forms a separation layer between the electrical conductor and an electrically insulative region 44. The transistor may have a stadium shape.

Referring to FIGS. 10-11, in implementations an EST robust semiconductor transistor (transistor) includes a semiconductor substrate 60 of a first conductivity type, a substrate contact region 66 of the first conductivity type coupled with the semiconductor substrate through a first well region 74/86 of the first conductivity type, the first well region separating the substrate contact region from the semiconductor substrate, a source region 62 of a second conductivity type coupled with the semiconductor substrate, a second well region 72/84 of the second conductivity type coupled with the semiconductor substrate, a drain region having a first drain region 68 of the first conductivity type and a second drain region 70 of the second conductivity type, a gate region 64, and a silicide coupled over the second drain region and a portion of the first drain region, wherein a portion of the first drain region not covered by the silicide forms a resistive electrical ballast region 80 having a width of at least 3 microns and configured to protect the transistor from ESD induced voltage pulses, and wherein the transistor forms a silicon controlled rectifier field effect transistor (SCR FET).

Still referring to FIGS. 10-11, in implementations the SCR JFET could form a metal-semiconductor field effect transistor (MESFET), a metal-oxide semiconductor field effect transistor (MOSFET), a superjunction FET, and the like. In implementations the SCR FET forms a laterally diffused metal oxide semiconductor (SCR LDMOS) transistor. In implementations the first conductivity type is P type conductivity and the second conductivity type is N type conductivity, though these polarities may be reversed in other implementations. In implementations the semiconductor substrate includes a P type substrate, the substrate contact region includes a P+ substrate contact region, the first well region includes a P well region, the second well region includes an N well region, the source region includes an N+ source region, the gate region includes an N+ gate region, the first drain region includes a P+ drain region, and the second drain region includes an N+ drain region. Referring to FIG. 10, in implementations the first well region 74 fully separates the substrate contact region 66 from the semiconductor substrate 60 and the first well region directly contacts the semiconductor substrate. Referring to FIG. 11, in implementations the second well region 84 fully separates the first well region 86 from the semiconductor substrate 60.

Examples of conventional transistor designs may be found in the following references, each of which is entirely incorporated herein by reference: Fujiwara, S., Nakaya, K., Hirano, T., Okuda, T., Watanabe, Y., "Source engineering for ESD robust NLDMOS," published at 33rd Electrical Overstress/Electrostatic Discharge Symposium (EOS/ESD), 11-16 Sep. 2011, Anaheim Calif., pg. 1-6; Pendharkar, S., Teggatz, R., Devore, J., Carpenter, J., Efland, T., Chin-Yu Tsai, "SCR-LDMOS: A novel LDMOS device with ESD robustness," published at The 12th International Symposium on Power Semiconductor Devices and ICs, 2000, pg. 341-344; Jung-Ruey Tsai, Yuan-Min Lee, Min-Chin Tsai, Gene Sheu, Shao-Ming Yang, "Development of ESD robustness enhancement of a novel 800V LDMOS multiple RESURF with linear P-top rings," published at TENCON 2011-2011 IEEE Region 10 Conference, pg. 760-763, 21-24 Nov. 2011; Chin-Yu Tsai, Taylor Efland, Sameer Pendharkar, Jozef Mitros, Alison Tessmer, Jeff Smith, John Erdeljac, Lou Hutter, "16-60V Rated LDMOS Show Advanced Performance in an 0.72 um Evolution BiCMOS Power Technology," published in Technical Digest of International Electron Devices Meeting (IEDM) 1997 by IEEE, p. 367-370, disclosed at conference proceedings at least as early as 10 Dec. 1997 at Washington, D.C., and; Jeffrey Smith, Alison Tessmer, Lily Springer, Praful Madhani, John Erdeljac, Jozef Mitros, Taylor Efland, Chin-Yu Tsai, Sameer Pendharkar, Louis Hutter, "A 0.7 um Linear BiCMOS/DMOS Technology for Mixed-Signal/Power Applications," Published in Proceedings of the Bipolar/BiCMOS Circuits and Technology Meeting 1997, p. 155-157 by IEEE, disclosed at conference proceedings at least as early as 30 Sep. 1997 at Minneapolis, Minn.

In places where the description above refers to particular implementations of ESD robust transistors and related methods and implementing components, sub-components, methods and sub-methods, it should be readily apparent that a number of modifications may be made without departing from the spirit thereof and that these implementations, implementing components, sub-components, methods and sub-methods may be applied to other ESD robust transistors and related methods.

What is claimed is:

1. An electrostatic discharge robust semiconductor transistor, comprising:
   a semiconductor substrate of a first conductivity type;
   a substrate contact region of the first conductivity type coupled with the semiconductor substrate;
   a source region of a second conductivity type coupled with the semiconductor substrate;
   a channel region of the second conductivity type;
   a gate region of the first conductivity type;
   a drain region comprising a first drain region of the first conductivity type and a second drain region of the second conductivity type, and;
   an electrical conductor directly coupled to and over the second drain region and a portion of the first drain region;
   wherein a portion of the first drain region is not covered by the electrical conductor and becomes a resistive electrical ballast region configured to protect the transistor from electrostatic discharge (ESD) induced voltage pulses, and;
   wherein the transistor comprises a silicon controlled rectifier junction field effect transistor (SCR JFET).

2. The transistor of claim 1, wherein the first conductivity type is P type conductivity, the second conductivity type is N type conductivity, the channel region comprises an N− channel region, and the transistor comprises an N− channel SCR JFET.

3. The transistor of claim 2, wherein the semiconductor substrate comprises a P type substrate, the substrate contact region comprises a P+ substrate contact region, the source region comprises an N+ source region, the gate region comprises a P+ gate region, the first drain region comprises a P+ drain region, and the second drain region comprises an N+ drain region.

4. The transistor of claim 1, wherein the electrical conductor comprises a silicide.

5. The transistor of claim 1, wherein the resistive electrical ballast region comprises a width of at least 3 microns.

6. The transistor of claim 1, wherein the resistive electrical ballast region comprises a separation layer between the electrical conductor and an electrically insulative region.

7. The transistor of claim 1, wherein the transistor comprises a stadium shape.

8. An electrostatic discharge robust semiconductor transistor, comprising:
   a semiconductor substrate of a first conductivity type;
   a first substrate contact region of the first conductivity type coupled with the semiconductor substrate;
   a source region of a second conductivity type coupled with the semiconductor substrate;
   a channel region of the second conductivity type;
   a gate region of the first conductivity type;
   a drain region comprising a first drain region of the first conductivity type and a second drain region of the second conductivity type;
   a second substrate contact region of the second conductivity type coupled with the semiconductor substrate, and;
   an electrical conductor directly coupled to and over the second drain region and a portion of the first drain region;
   wherein a portion of the first drain region is not covered by the electrical conductor and becomes a resistive electrical ballast region configured to protect the transistor from electrostatic discharge (ESD) induced voltage pulses, and;

wherein the transistor comprises a silicon controlled rectifier junction field effect transistor (SCR JFET).

9. The transistor of claim 8, wherein the first conductivity type is P type conductivity and the second conductivity type is N type conductivity, wherein the channel region comprises an N− channel region, and wherein the SCR JFET comprises an N− channel SCR JFET.

10. The transistor of claim 8, wherein the semiconductor substrate comprises a P type substrate, the first substrate contact region comprises a P+ substrate contact region, the source region comprises an N+ source region, the channel region comprises an N− channel region, the gate region comprises a P+ gate region, the first drain region comprises a P+ drain region (P+ anode), the second drain region comprises an N+ drain region, and the second substrate contact region comprises an N+ substrate contact region (N+ cathode).

11. The transistor of claim 8, wherein the electrical conductor comprises a silicide.

12. The transistor of claim 8, wherein the resistive electrical ballast region comprises a width of at least 3 microns.

13. The transistor of claim 8, wherein the resistive electrical ballast region comprises a separation layer between the electrical conductor and an electrically insulative region.

14. The transistor of claim 8, wherein the transistor comprises a stadium shape.

15. An electrostatic discharge robust semiconductor transistor, comprising:
    a semiconductor substrate of a first conductivity type;
    a first substrate contact region of the first conductivity type coupled with the semiconductor substrate;
    a source region of a second conductivity type coupled with the semiconductor substrate;
    a channel region of the second conductivity type;
    a gate region of the first conductivity type;
    a drain region comprising a first drain region of the first conductivity type and a second drain region of the second conductivity type;
    an electrically insulative region between the drain region and the gate region; and
    an electrical conductor directly coupled over the second drain region and a portion of the first drain region;
    wherein a portion of the first drain region is not covered by the electrical conductor and becomes a resistive electrical ballast region configured to protect the transistor from electrostatic discharge (ESD) induced voltage pulses, and;
    wherein the transistor comprises a silicon controlled rectifier junction field effect transistor (SCR JFET).

16. The transistor of claim 15, further comprising a second substrate contact region of the second conductivity type coupled with the semiconductor substrate.

17. The transistor of claim 15, wherein the first conductivity type is P type conductivity, the second conductivity type is N type conductivity, the channel region comprises an N− channel region, and the transistor comprises an N-channel SCR JFET.

18. The transistor of claim 17, wherein the semiconductor substrate comprises a P type substrate, the first substrate contact region comprises a P+ substrate contact region, the source region comprises an N+ source region, the gate region comprises a P+ gate region, the first drain region comprises a P+ drain region, and the second drain region comprises an N+ drain region.

19. The transistor of claim 15, wherein the resistive electrical ballast region comprises a width of at least 3 microns.

20. The transistor of claim 15, wherein the resistive electrical ballast region comprises a separation layer between the electrical conductor and the electrically insulative region.

* * * * *